US011246236B2

(12) United States Patent
Urai et al.

(10) Patent No.: US 11,246,236 B2
(45) Date of Patent: Feb. 8, 2022

(54) LIQUID COOLING JACKET, LIQUID COOLING SYSTEM, AND ELECTRONIC DEVICE

(71) Applicant: FUJITSU LIMITED, Kawasaki (JP)

(72) Inventors: Takashi Urai, Kawasaki (JP); Yuki Kanai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/891,688

(22) Filed: Jun. 3, 2020

(65) Prior Publication Data

US 2020/0390006 A1 Dec. 10, 2020

(30) Foreign Application Priority Data

Jun. 10, 2019 (JP) .............................. JP2019-107938

(51) Int. Cl.
*H05K 7/20* (2006.01)

(52) U.S. Cl.
CPC ....... *H05K 7/20272* (2013.01); *H05K 7/2039* (2013.01)

(58) Field of Classification Search
CPC . G06F 2200/201; G06F 1/20; H05K 7/20927; H05K 7/20772; H05K 7/209; H05K 7/20781; H05K 7/2039; H05K 7/20254; H05K 7/20763; H05K 7/20809; H05K 7/02; H05K 1/0203; H05K 7/20272
See application file for complete search history.

(56) References Cited

U.S. PATENT DOCUMENTS

| | | | | |
|---|---|---|---|---|
| 6,349,035 B1* | 2/2002 | Koenen | ............... | H01L 23/4093 257/727 |
| 8,059,406 B1* | 11/2011 | Meyer, IV | .......... | H01L 23/4093 361/701 |
| 8,659,897 B2* | 2/2014 | Meijer | ...................... | G06F 1/20 361/699 |
| 10,499,488 B1* | 12/2019 | Tsai | ...................... | H01L 23/473 |
| 10,602,640 B1* | 3/2020 | Tsai | ................... | H05K 7/20254 |
| 10,705,578 B2* | 7/2020 | Franz | ................. | H05K 7/20809 |
| 10,750,639 B2* | 8/2020 | Lunsman | ............... | H05K 1/181 |
| 2008/0084668 A1* | 4/2008 | Campbell | .......... | H05K 7/20509 361/702 |
| 2010/0006260 A1* | 1/2010 | Oh | ...................... | H01L 23/4093 165/80.2 |
| 2010/0252234 A1* | 10/2010 | Cambell | ............ | H05K 7/20781 165/80.2 |

(Continued)

FOREIGN PATENT DOCUMENTS

| | | |
|---|---|---|
| JP | 2001-308245 A | 11/2001 |
| JP | 2009-218299 A | 9/2009 |
| JP | 2011-228430 A | 11/2011 |

*Primary Examiner* — Adam B Dravininkas
(74) *Attorney, Agent, or Firm* — Westerman, Hattori, Daniels & Adrian, LLP

(57) ABSTRACT

A liquid cooling jacket with first and second heat receivers and a biasing spring. The first heat receiver having a first refrigerant pipe through which a refrigerant flow and a first heat conductive sheet that receives heat by being in contact with a cooling target. The second heat receiver is configured to approach and separate from the first heat receiver while facing the first heat conductive sheet. The spring biases the first heat receiver and the second heat receiver in an approaching direction.

14 Claims, 23 Drawing Sheets

(56) References Cited

U.S. PATENT DOCUMENTS

| | | | |
|---|---|---|---|
| 2011/0209855 A1* | 9/2011 | Peterson | G06F 1/20 165/104.26 |
| 2012/0020022 A1* | 1/2012 | Peterson | G06F 1/20 361/699 |
| 2013/0027870 A1* | 1/2013 | Goldr an | H01L 23/467 361/679.32 |
| 2013/0135812 A1* | 5/2013 | Barina | H01L 23/473 361/679.32 |
| 2013/0342987 A1* | 12/2013 | Yang | H01L 23/40 361/679.32 |

* cited by examiner

LIQUID COOLING JACKET, LIQUID COOLING SYSTEM, AND ELECTRONIC DEVICE

CROSS-REFERENCE TO RELATED APPLICATION

This application is based upon and claims the benefit of the prior Japanese Patent Application No. 2019-107938, filed on Jun. 10, 2019, the entire contents of which are incorporated herein by reference.

FIELD

The embodiments discussed herein are related to a liquid cooling jacket, a liquid cooling system, and an electronic device.

BACKGROUND

There is a double-sided cooling semiconductor device of a refrigerant-cooling type having a structure in which a flat surface of a refrigerant tube is in close contact with the outer main surface of a heat sink mass, and the inner main surface of the heat sink mass is in close contact with the outer main surface of an electrode terminal member of a semiconductor module through an insulating plate. In the double-sided cooling semiconductor device of a refrigerant-cooling type, a through-bolt is inserted through the upper end portion and the lower end portion of a pressing plate abutted on each of the left and right outermost flat surfaces of the refrigerant tube, and is fastened by a nut, so that there is a function of setting a clamping pressure force of the refrigerant tube on the semiconductor module.

There is a liquid cooling module including a heat sink for the front surface, a heat sink for the back surface, and a flexible tube that connects a pipe inlet of the front surface heat sink to a pipe outlet of the back surface heat sink. In the liquid cooling module, a base member of the front surface heat sink and a base member of the back surface heat sink are fixed to a printed board by a plurality of screws penetrating the base members and the printed board.

Further, there is a semiconductor module cooling device including cooling pipes provided on the inner facing surfaces of a housing and configured to cool a semiconductor module, and heat dissipation members provided between each of the cooling pipes and the semiconductor module and configured to dissipate the heat of the semiconductor module to the cooling pipe. In the semiconductor module cooling device, the semiconductor module and the heat dissipation members provided on both sides of the semiconductor module are integrally fixed by a mold member made of resin.

Related techniques are disclosed in, for example, Japanese Laid-Open Patent Publication Nos. 2001-308245, 2009-218299 and 2011-228430.

SUMMARY

According to an aspect of the embodiments, a liquid cooling jacket includes a first heat receiver configured to include a first refrigerant pipe through which a refrigerant flows and a first heat conductive sheet that receives heat by being in contact with a cooling target, a second heat receiver capable of approaching and separating from the first heat receiver and configured to face the first heat conductive sheet, and a spring configured to bias the first heat receiver and the second heat receiver in an approaching direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Cooling targets to be cooled by a liquid cooling jacket have different thicknesses depending on the types thereof. In a structure in which a cooling target is brought into contact with heat receiving members and is interposed between the heat receiving members in the thickness direction, the heat receiving member may be fixed by a bolt, a screw, or a mold member. However, for example, in the case where the cooling target is thin, a gap between the cooling target and the heat receiving member is widened. In order to fill the gap, it is considered to increase the thickness of a heat conductive sheet such as a thermal interface material (TIM) disposed between the cooling target and the heat receiving member. However, when the heat conductive sheet becomes thick, it becomes hard to transfer heat from the cooling target to the heat receiving member. That is, there is room for improvement in efficient cooling in accordance with various cooling targets with different thicknesses.

Hereinafter, descriptions will be made on embodiments of a technology capable of performing efficient cooling in accordance with various cooling targets with different thicknesses, with reference to drawings.

First Embodiment

Figure 1:
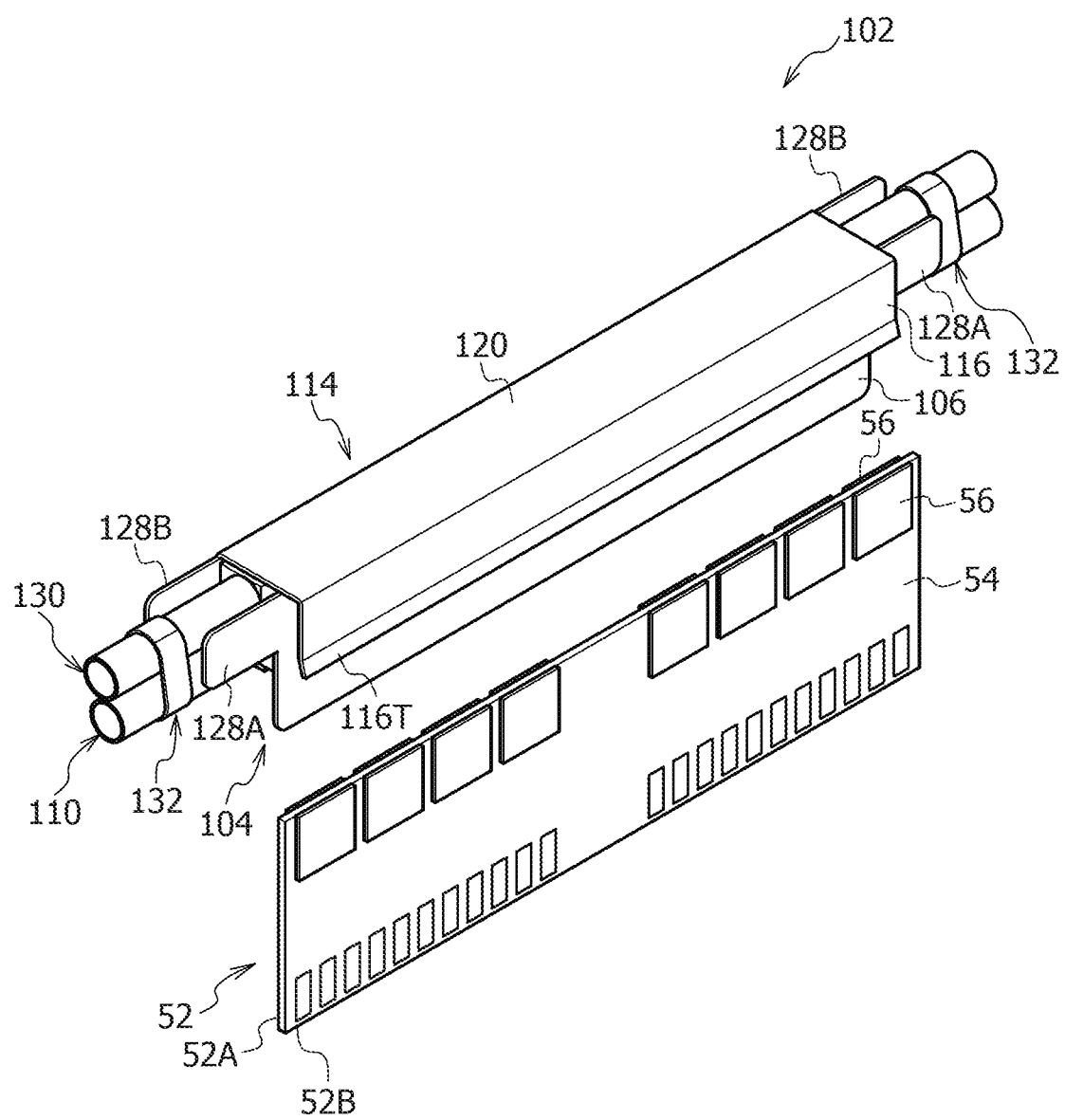
FIG. 1 is a perspective view illustrating a liquid cooling jacket of a first embodiment, together with a memory module.

FIG. 1 is a perspective view illustrating a liquid cooling jacket of a first embodiment together with a memory module. A liquid cooling system and an electronic device including the liquid cooling jacket 102 will be described in detail with reference to drawings.

Figure 2:
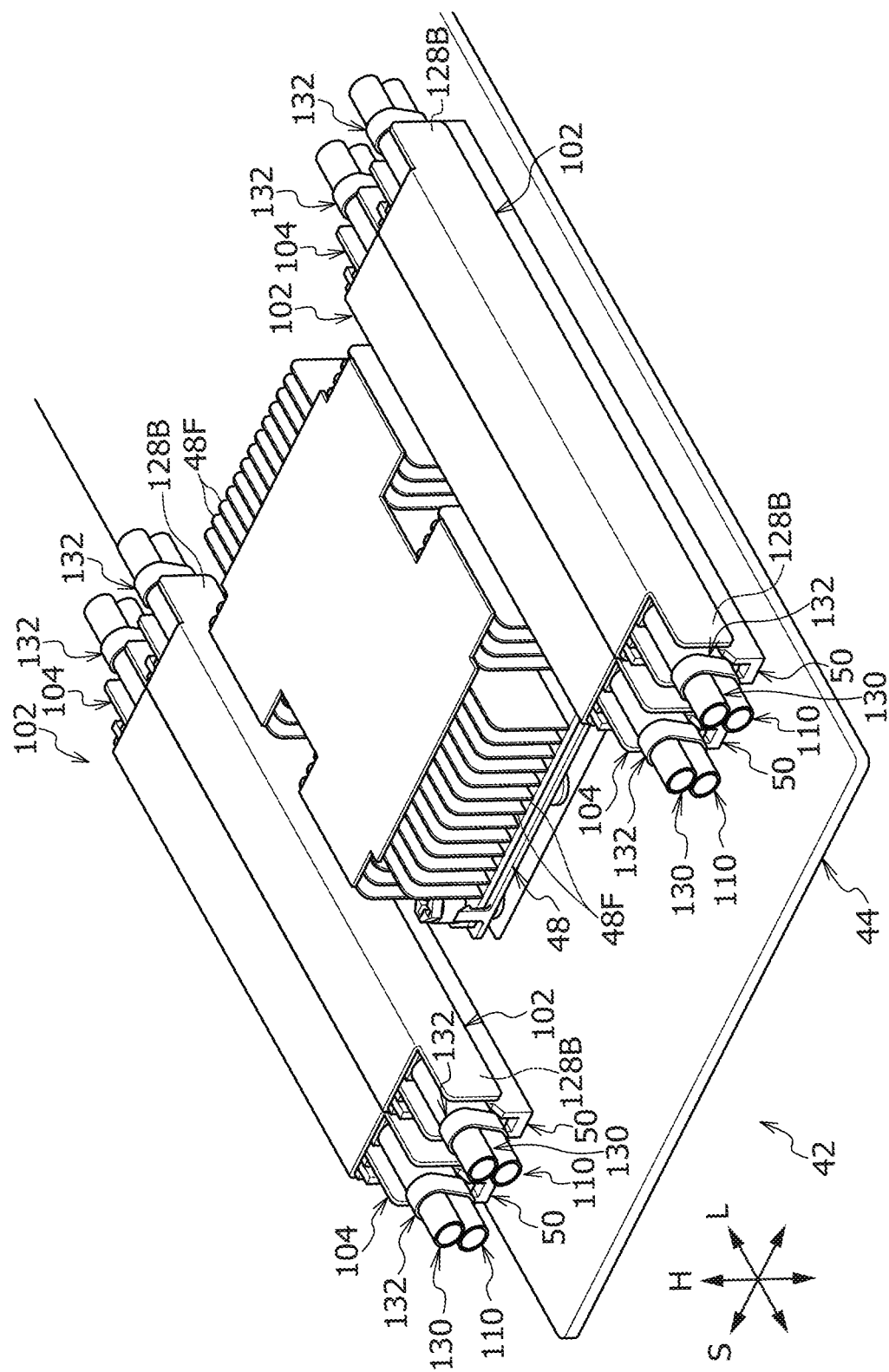
FIG. 2 is a perspective view partially illustrating an electronic device of the first embodiment.
Figure 3:
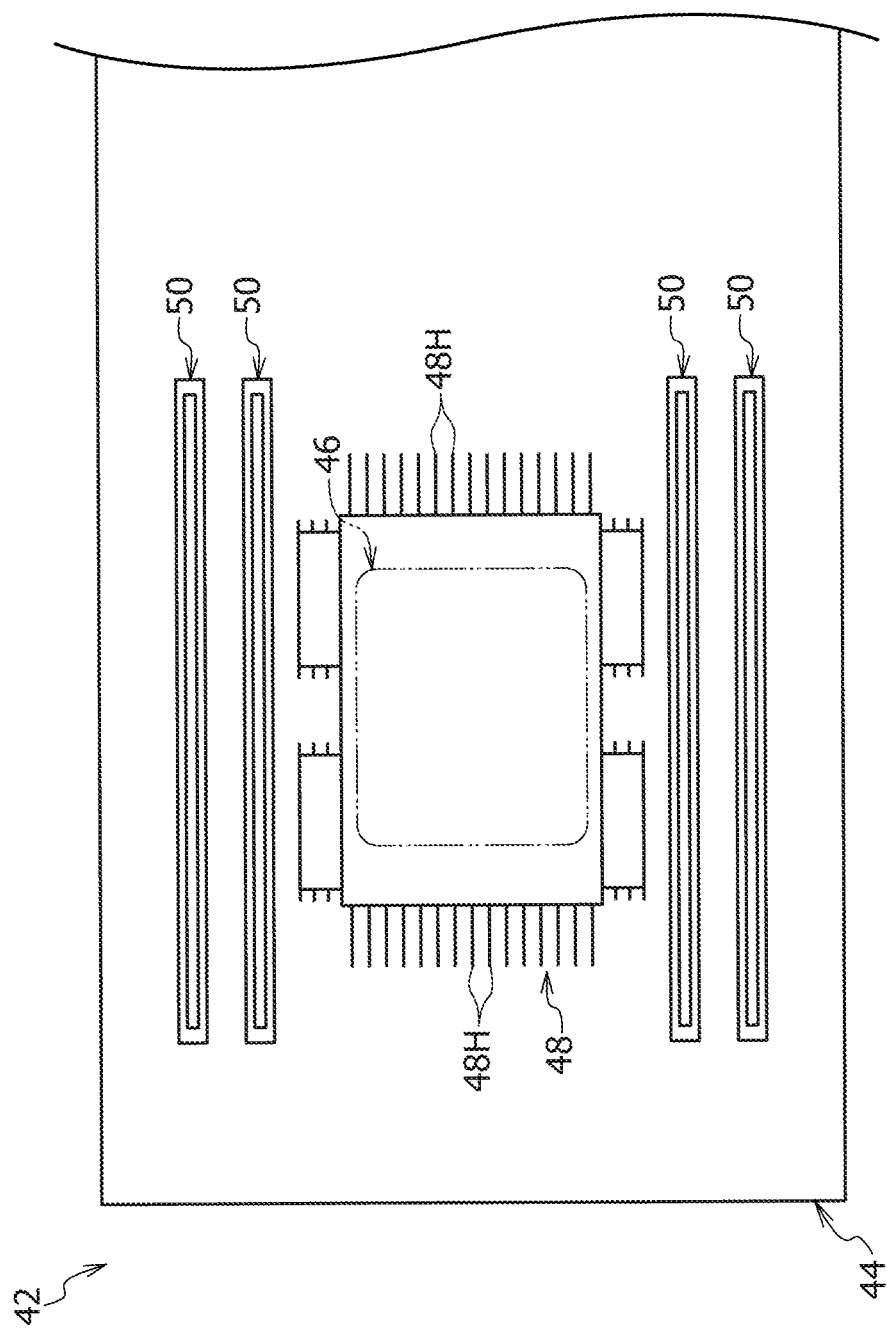
FIG. 3 is a plan view partially illustrating the electronic device of the first embodiment.

FIGS. 2 and 3 illustrate an electronic device 42. The electronic device 42 is, for example, a server, a computer, or various communication devices, and has a board 44. In the drawing, the lengthwise direction, the short-side direction, and the height direction of the board 44 are indicated by arrows L, S, and H, respectively.

As illustrated in FIG. 3, a processor 46 is mounted on the board 44. The processor 46 is provided with a heat dissipation member 48, and heat is dissipated from the processor 46 by the heat dissipation member 48. In the present embodiment, the heat dissipation member 48 has a plurality of fins 48F, and heat is dissipated from the heat dissipation member 48 through air cooling.

On the board 44, one or more sockets 50 are arranged at positions around the processor 46. In the example illustrated in FIG. 3, four sockets 50 are arranged with the processor 46 interposed therebetween in which two sockets are parallel.

Figure 4:
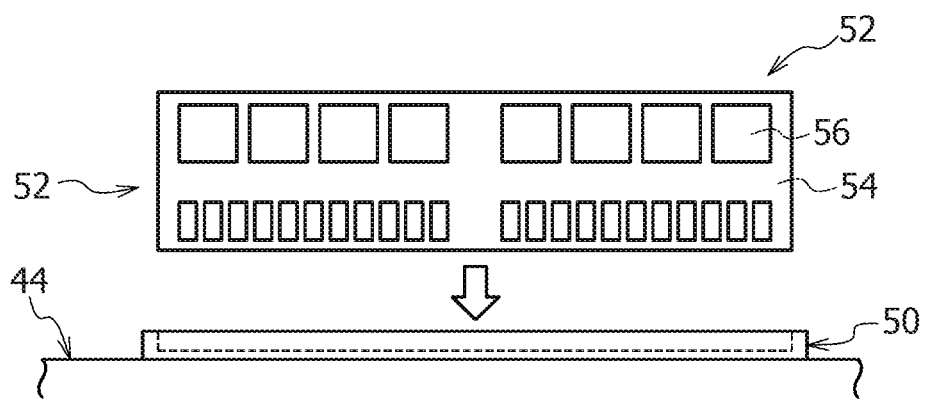
FIG. 4 is a front view illustrating the memory module on which the liquid cooling jacket of the first embodiment is to be mounted, together with a socket.

As illustrated in FIG. 4, a memory module 52 may be mounted in each of the sockets 50. The memory module 52 has a memory board 54, and one or more memory chips 56 are mounted on the memory board 54.

The memory module 52, which is inserted in the socket 50, is electrically connected to circuits on the board 44 through contacts of the memory board 54. In the example illustrated in FIG. 2, although the memory modules 52 are mounted in all four sockets 50, there may be a socket 50 in which the memory module 52 is not mounted, depending on the memory capacity required for the electronic device 42. In the present embodiment, a volatile memory is exemplified as the memory module 52, but a non-volatile memory may be employed.

In the present embodiment, in the memory module 52, the memory chips 56 are mounted side by side on both surfaces of the memory board 54, that is, one surface (a first surface 54A) and the other surface (a second surface 54B), respectively. The memory module 52 is an example of an electronic component, and is also an example of a cooling target.

The liquid cooling jacket 102 is mounted on the memory module 52. As illustrated in FIGS. 5 to 8, the liquid cooling jacket 102 includes a first heat receiving member 104 and a second heat receiving member 114. The second heat receiving member 114 is an example of an opposing member.

The first heat receiving member 104 includes a first opposing plate 106 facing one surface (a first surface 52A) of the memory module 52. A first heat conductive sheet 108 is bonded to the first opposing plate 106. The position and the size of the first heat conductive sheet 108 are a position and a size by which the first heat conductive sheet 108 is capable of being in close contact with the memory chips 56 mounted on the first surface 52A of the memory module 52.

The first heat conductive sheet 108 is a sheet-shaped member that receives heat of the memory chips 56 by being in close contact with the memory chips 56 on the first surface 52A of the memory module 52. In particular, even if there is unevenness on the surfaces of the memory chips 56, the first heat conductive sheet 108 is deformed following the unevenness, and thus a wide area in contact with the memory chips 56 may be secured.

Figure 7:
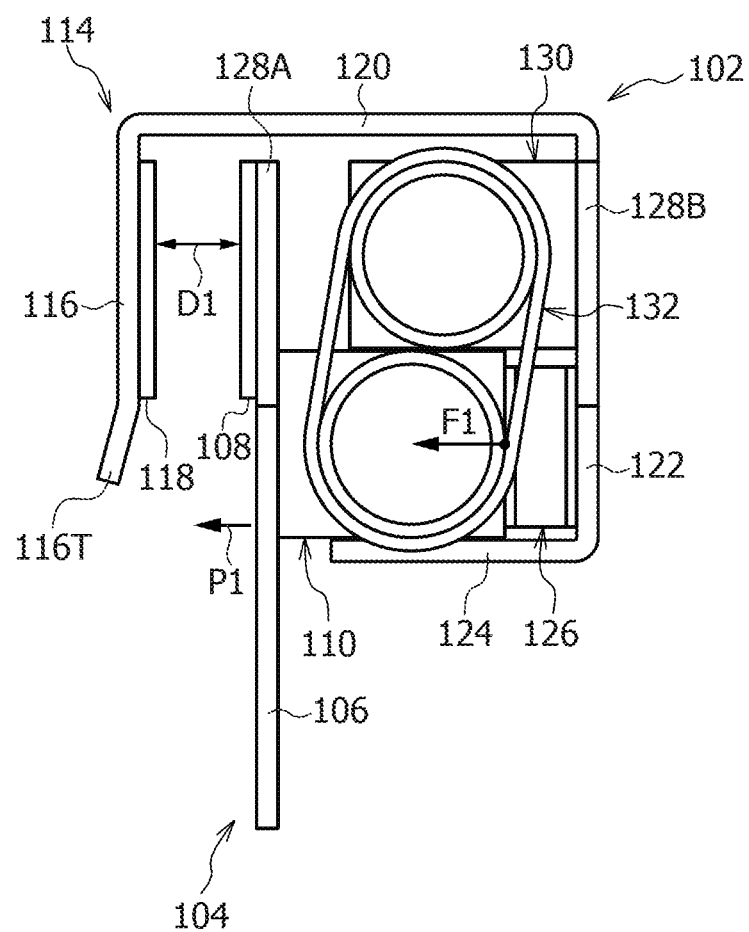
FIG. 7 is a side view illustrating the liquid cooling jacket of the first embodiment.

A first refrigerant pipe 110 is fixed through soldering, etc. to a surface of the first opposing plate 106 on the opposite side of a surface to which the first heat conductive sheet 108 is bonded. In the first embodiment, as illustrated in FIG. 7, the position of the first refrigerant pipe 110 fixed to the first opposing plate 106 is a center position in the first opposing plate 106 in the vertical direction, that is, a center position of the first heat receiving member 104 in the vertical direction. The first refrigerant pipe 110 is a member having a higher bending rigidity than the first opposing plate 106, and this member having a high bending rigidity is fixed to the first opposing plate 106 along the lengthwise direction.

As described below, a liquid refrigerant flows through the first refrigerant pipe 110. Heat applied from the memory chips 56 to the first opposing plate 106 via the first heat conductive sheet 108 is transferred to the refrigerant flowing through the first refrigerant pipe 110. As for the refrigerant, water may be used in the present embodiment. Besides water, for example, oil having predetermined physical properties may be used.

The second heat receiving member 114 includes a second opposing plate 116 facing the other surface (a second surface 52B) of the memory module 52. The second opposing plate 116 is parallel to the first opposing plate 106, but at a lower portion thereof, a tapered portion 116T is formed while inclined with respect to the first opposing plate 106. Due to the tapered portion 116T, a gap between the first opposing plate 106 and the second opposing plate 116 is widening downwards.

A second heat conductive sheet 118 is bonded to the second opposing plate 116. The position and the size of the second heat conductive sheet 118 are a position and a size by which the second heat conductive sheet 118 is capable of being in close contact with the memory chips 56 on the second surface 52B of the memory module 52.

The second heat conductive sheet 118 is a sheet-shaped member that receives heat of the memory chips 56 by being in close contact with the memory chips 56 on the second surface 52B of the memory module 52. Similarly to the first heat conductive sheet 108, the second heat conductive sheet 118 follows the unevenness on the surfaces of the memory chips 56 and comes in contact with a wide contact area. The second surface 52B is a back surface of a surface in contact with the first heat conductive sheet 108.

The second heat receiving member 114 includes a horizontal plate 120 extending in the transverse direction from the upper end of the second opposing plate 116 over the first heat receiving member 104, and a wraparound portion 122 extending downwards from the leading end of the horizontal plate 120.

The wraparound portion 122 is parallel to the second opposing plate 116, and is also parallel to the first opposing plate 106. The wraparound portion 122 is disposed with a predetermined gap between the wraparound portion 122 and the first opposing plate 106, and the first refrigerant pipe 110 is located between the wraparound portion 122 and the first opposing plate 106.

A second refrigerant pipe 130 is fixed to the wraparound portion 122 through soldering, etc. In the first embodiment, the second refrigerant pipe 130 is located between the wraparound portion 122 and the first opposing plate 106, and between the horizontal plate 120 and the first refrigerant pipe 110. Similarly to the first refrigerant pipe 110, a liquid refrigerant flows through the second refrigerant pipe 130. Heat applied from the memory chips 56 to the second opposing plate 116 via the second heat conductive sheet 118 is transferred to the refrigerant flowing through the second refrigerant pipe 130.

The second heat receiving member 114 is relatively movable within a predetermined range with respect to the first heat receiving member 104, in the arrow P1 direction and a direction opposite thereto.

Figure 8:
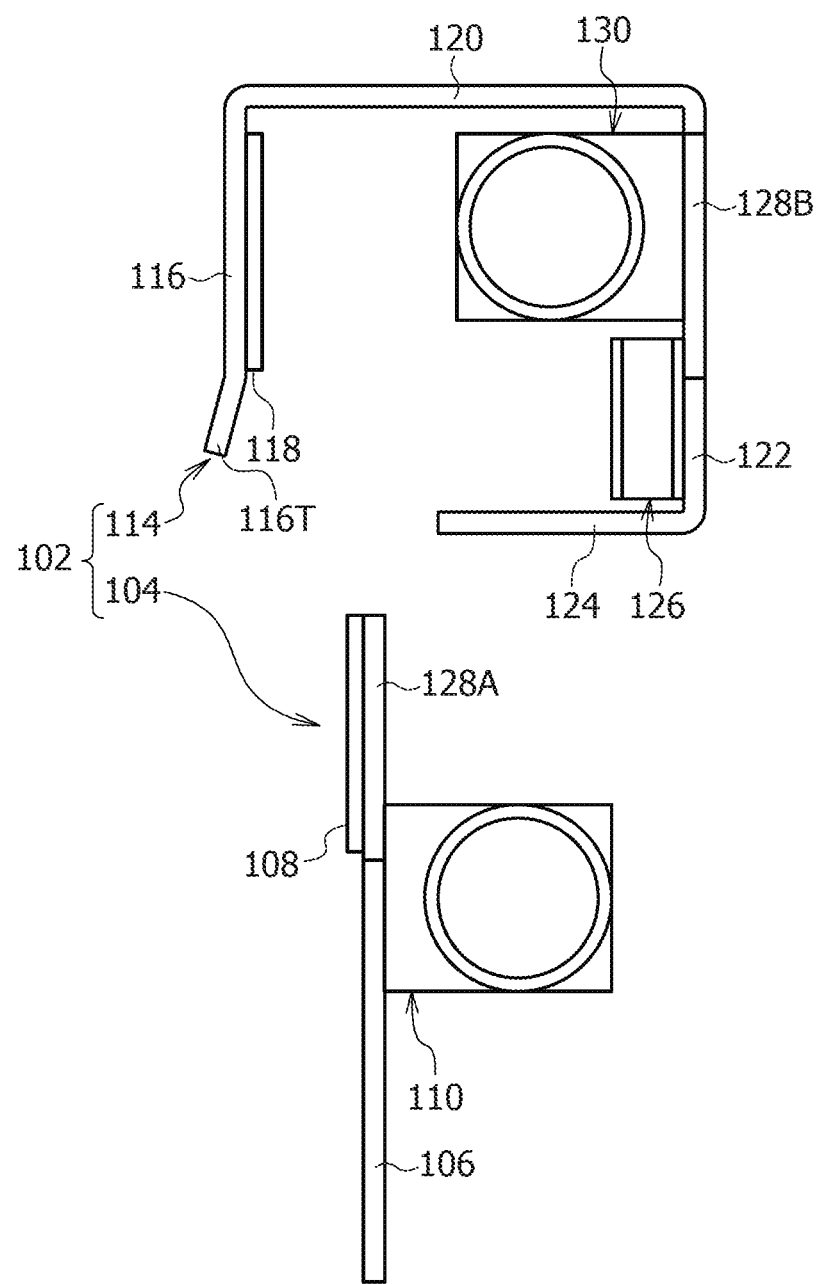
FIG. 8 is an exploded side view illustrating the liquid cooling jacket of the first embodiment.

As illustrated in FIG. 8, a plate spring 126 is attached to the wraparound portion 122. As illustrated in FIG. 7, in a state where the first heat receiving member 104 and the second heat receiving member 114 are assembled, the plate spring 126 is located between the wraparound portion 122 and the first refrigerant pipe 110, and applies the elastic force F1 to the first heat receiving member 104 in the arrow P1 direction. Accordingly, the first opposing plate 106 is pushed by the plate spring 126 via the first refrigerant pipe 110 in a direction of approaching the second opposing plate 116.

Since the first refrigerant pipe 110 is fixed at the center position of the first opposing plate 106 in the vertical direction, a force in the arrow P1 direction is applied to the center position of the first opposing plate 106 in the vertical direction.

The moving range of the first opposing plate 106 in the arrow P1 direction is set such that even when a gap D1 between the first heat conductive sheet 108 and the second heat conductive sheet 118 is smallest, the gap D1 is smaller than a thickness T1 (see FIG. 9) of a portion of the memory chips 56 in the memory module 52 as a cooling target. In particular, as described below, in the present embodiment, there is a structure in accordance with various memory modules 52 having different thicknesses. Therefore, setting is made such that the gap D1 between the first heat conductive sheet 108 and the second heat conductive sheet 118 may be made smaller than the thickness T1 of the thinnest memory module 52.

Meanwhile, the length of the plate spring 126 (the maximum length in the extension state in the arrow P1 direction) is set such that the first heat conductive sheet 108 may not directly come in contact with the second heat conductive sheet 118. Otherwise, a limiting member capable of limiting the moving range of the first opposing plate 106 to a predetermined range may be provided.

As illustrated in FIG. 7, a lower plate 124 extends from the lower end of the wraparound portion 122 toward the second heat receiving member 114 below the first refrigerant pipe 110. Since the first refrigerant pipe 110 is located between the second refrigerant pipe 130 and the lower plate 124, a vertical relative movement between the first heat receiving member 104 and the second heat receiving member 114 is restricted.

Figure 5:
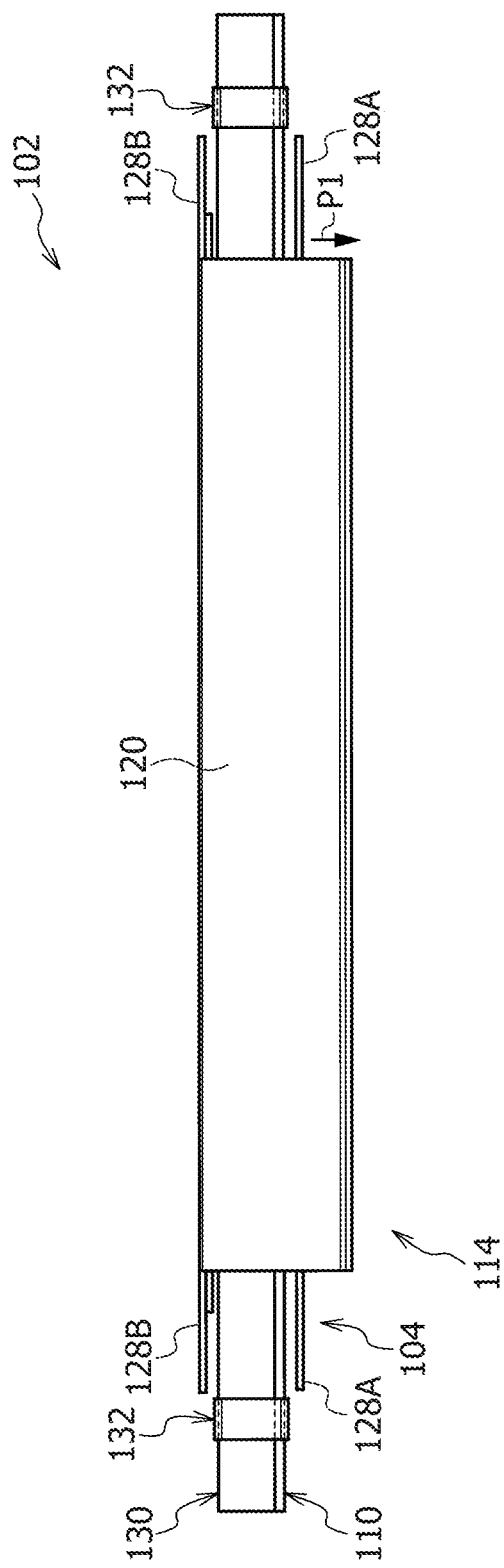
FIG. 5 is a plan view illustrating the liquid cooling jacket of the first embodiment.
Figure 6:
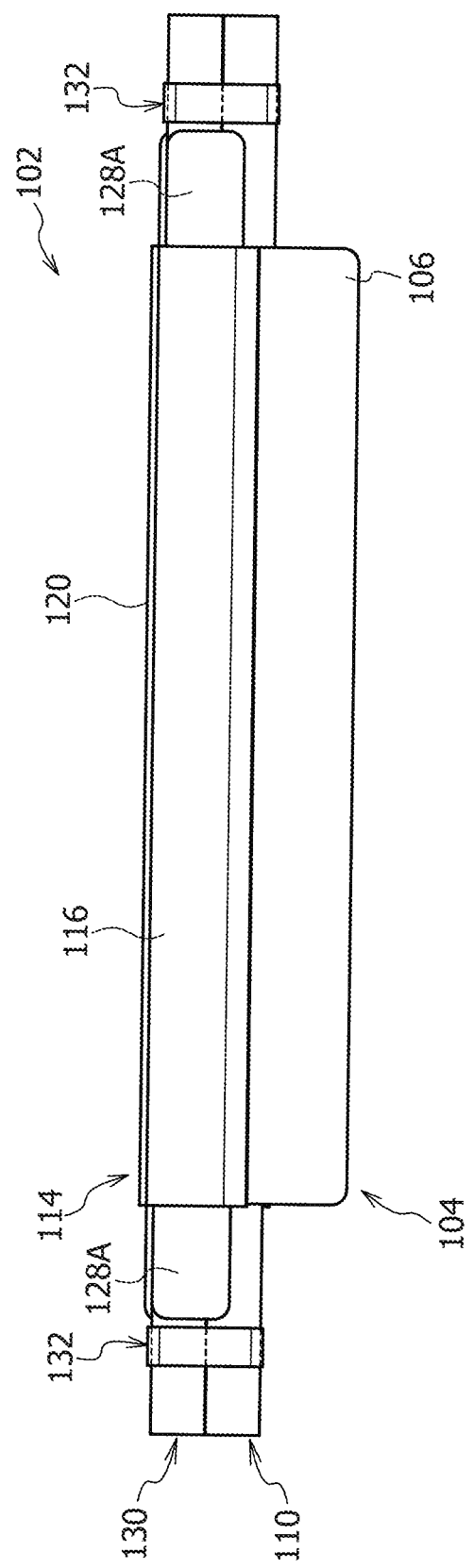
FIG. 6 is a front view illustrating the liquid cooling jacket of the first embodiment.

As illustrated in FIGS. 1 and 5, operation pieces 128A protrude from both ends of the first opposing plate 106 in the lengthwise direction. Also, operation pieces 128B protrude from both ends of the wraparound portion 122 of the second heat receiving member 114 in the lengthwise direction. The operation piece 128A and the operation piece 128B are plate-shaped portions which face each other in parallel with a predetermined gap in an approaching direction of the first opposing plate 106 (the arrow P1 direction). The operation piece 128A and the operation piece 128B are paired at each of both sides of the first refrigerant pipe 110 in the lengthwise direction.

When the first opposing plate 106 and the second opposing plate 116 are separated from each other, the first opposing plate 106 and the wraparound portion 122 approach each other. Thus, when a force is applied to the operation piece 128A and the operation piece 128B in a direction in which they approach each other, the first opposing plate 106 may be moved against the elastic force of the plate spring 126 in a direction in which the first opposing plate 106 is separated from the second opposing plate 116 (a direction opposite to the arrow P1). Then, when the first opposing plate 106 is moved in a direction in which the first opposing plate 106 is separated from the second opposing plate 116, the gap D1 between the first heat conductive sheet 108 and the second heat conductive sheet 118 is widened.

The second refrigerant pipe 130 is parallel to the first refrigerant pipe 110. Then, each of the first refrigerant pipe 110 and the second refrigerant pipe 130 has a length further protruding from the operation pieces 128A and 128B in the lengthwise direction. An annular rubber 132 may be wound around these protruding portions, in the first refrigerant pipe 110 and the second refrigerant pipe 130. The first refrigerant pipe 110 and the second refrigerant pipe 130 are fixed to each other by the elastic force of the annular rubber 132, and then the relative position is maintained constant. Meanwhile, the elastic force of the annular rubber 132 is set to be smaller than the elastic force of the plate spring 126. Thus, the first heat receiving member 104 is not moved by the elastic force of the annular rubber 132 in a direction in which the first heat conductive sheet 108 is separated from the second heat conductive sheet 118, that is, in the opposite direction to the arrow P1. Then, it is possible to change a relative position between the first refrigerant pipe 110 and the second refrigerant pipe 130 against the elastic force of the annular rubber 132.

Figure 12:
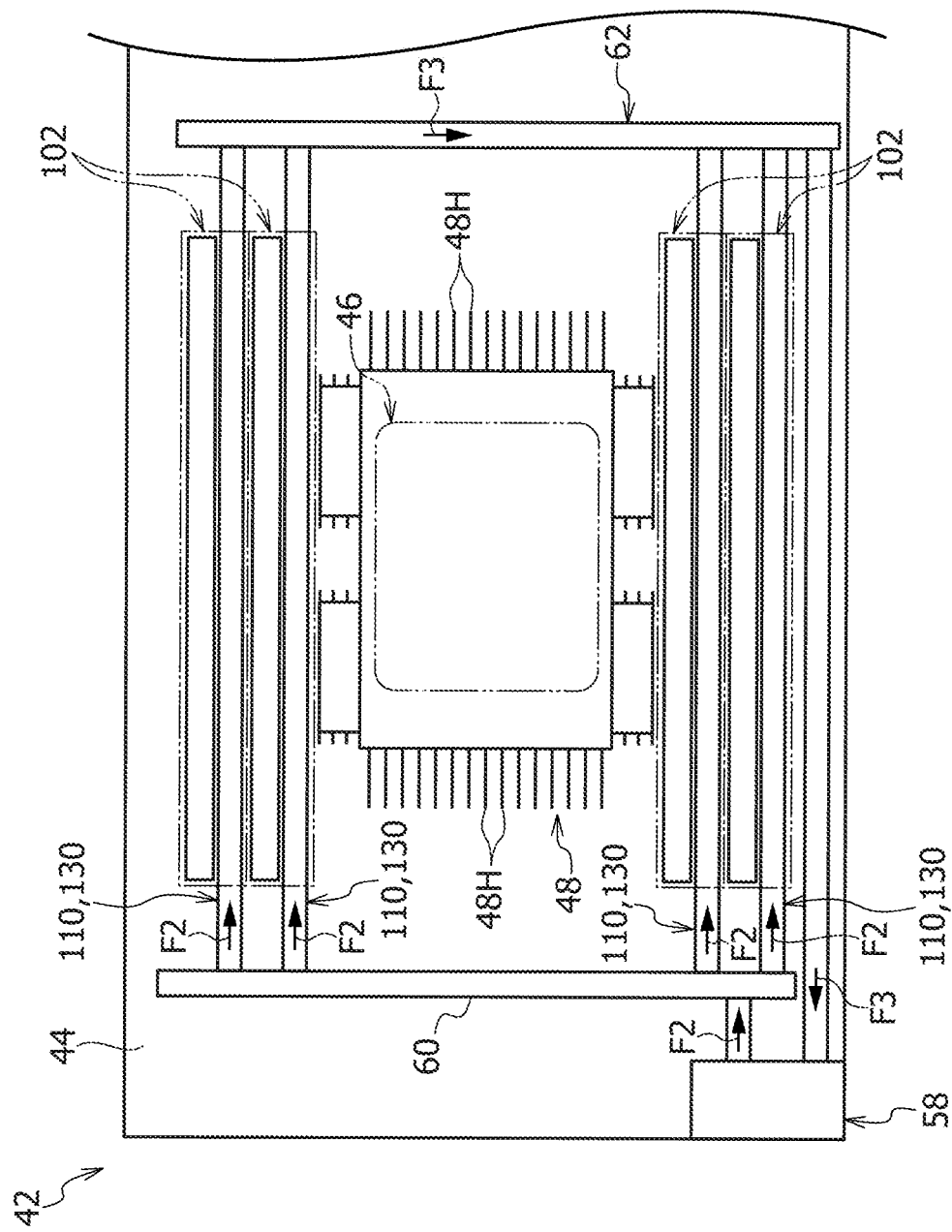
FIG. 12 is a plan view illustrating the electronic device of the first embodiment, together with a flow of a refrigerant in liquid cooling jackets.

As illustrated in FIG. 12, a connection section 58 is formed in the electronic device 42. A pipe is connected to the connection section 58 to allow a refrigerant to pass (circulate) through the electronic device 42 from the outside.

From the connection section 58, the refrigerant is distributed to the first refrigerant pipes 110 and the second refrigerant pipes 130 of a plurality of liquid cooling jackets 102, through a distribution pipe 60. Then, the refrigerants that have flowed through the first refrigerant pipes 110 and the second refrigerant pipes 130 of the plurality of liquid cooling jackets 102 merge in a confluence pipe 62, and then are discharged from the connection section 58 to the outside of the electronic device 42.

Figure 13:
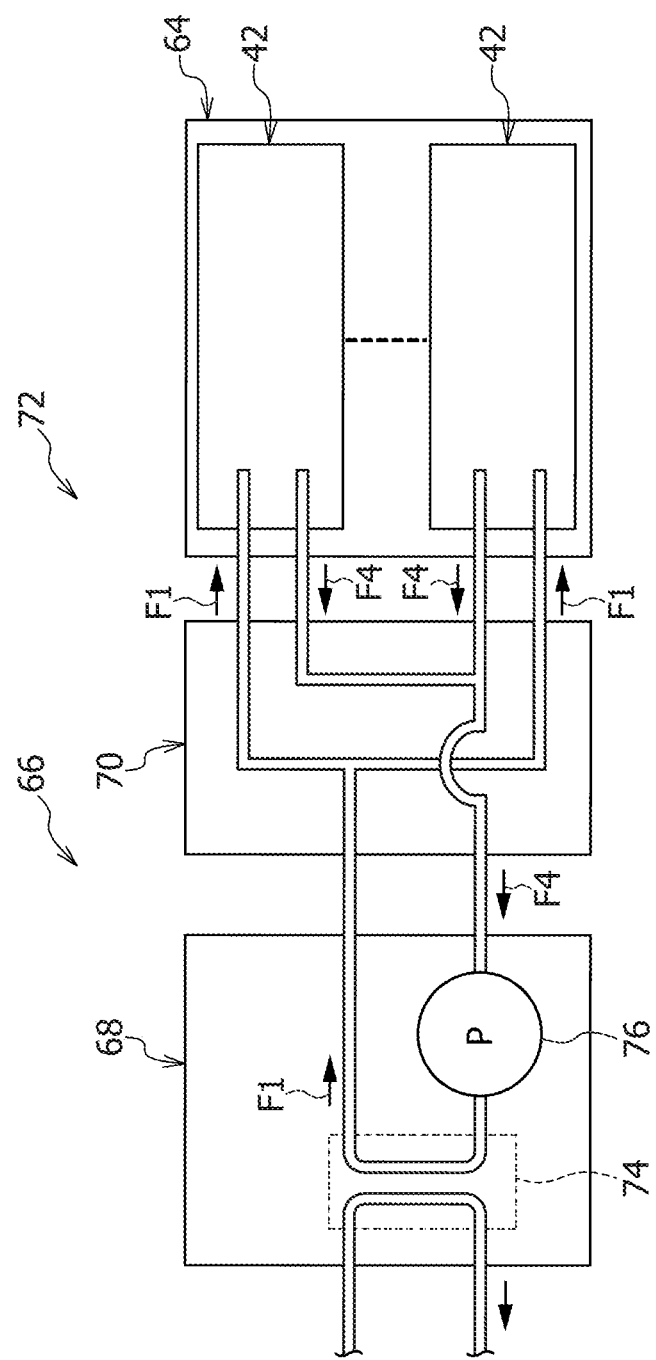
FIG. 13 is a view illustrating a liquid cooling system of the first embodiment.

As illustrated in FIG. 13, one or more electronic devices 42 are accommodated in a rack 64. By a liquid cooling system 72, a refrigerant is supplied to and is circulated through the plurality of electronic devices 42 accommodated in the rack 64 so that the memory modules 52 (the memory chips 56, see FIG. 1) as cooling targets are cooled.

A refrigerant supply device 66 is provided outside the rack 64. The refrigerant supply device 66 includes a heat exchange unit 68 and a manifold 70, and the heat exchange unit 68 further includes a heat exchanger 74 and a pump 76. The refrigerants (high-temperature refrigerants with received heat) sent from the electronic devices 42, respectively, merge in the manifold 70 and reach the pump 76. The refrigerant pressurized by the pump 76 is cooled by heat exchange in the heat exchanger 74, and is distributed to each of the electronic devices 42 from the manifold 70.

Next, descriptions will be made on effects of the present embodiment, and a method of mounting the liquid cooling jacket 102 on the memory module 52.

Figure 9:
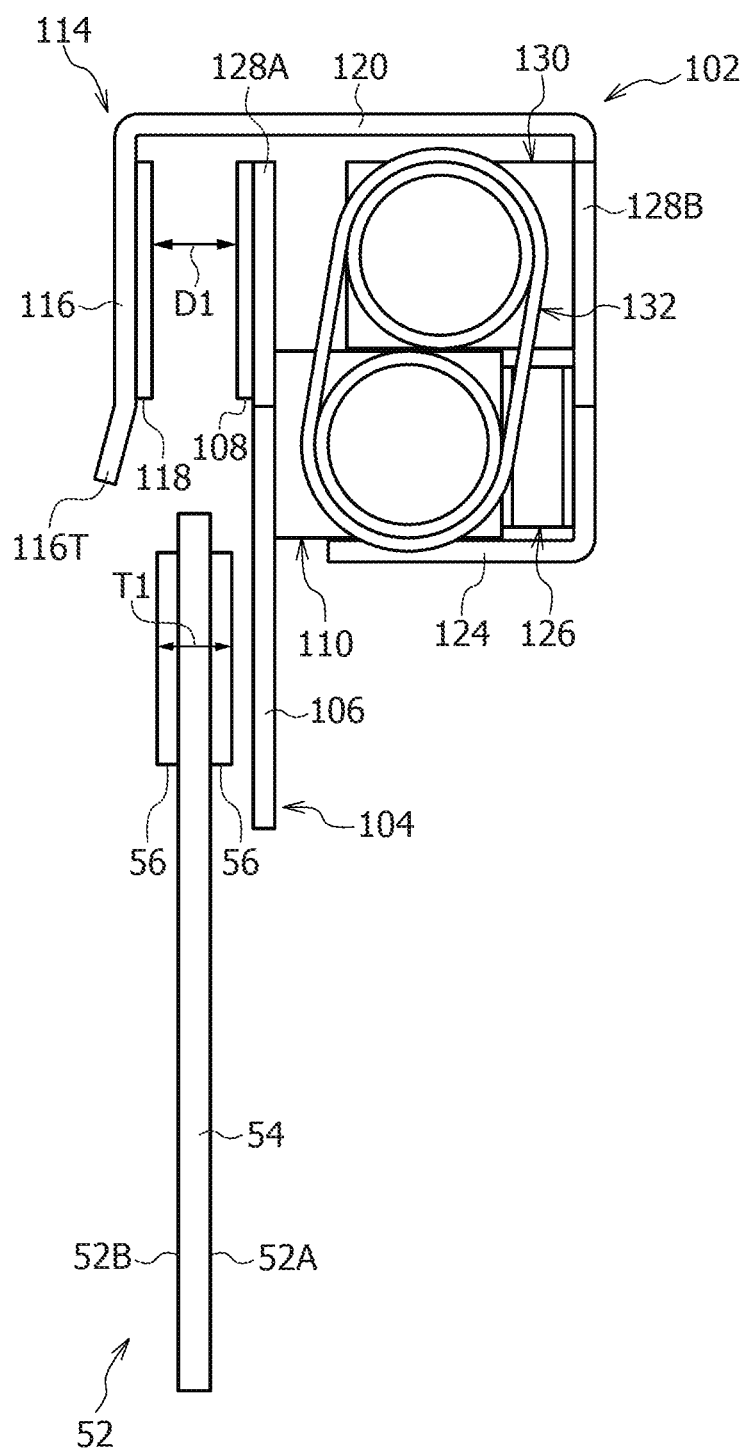
FIG. 9 is a side view illustrating a state where the liquid cooling jacket of the first embodiment is being mounted on the memory module.

As illustrated in FIG. 9, in order to mount the liquid cooling jacket 102 on the memory module 52, a force in an approaching direction is applied to the operation pieces 128A and 128B. Accordingly, the gap D1 between the first heat conductive sheet 108 and the second heat conductive sheet 118 may be widened against the elastic force of the plate spring 126. The gap D1 becomes wider than the thickness T1 of the memory module 52 on which the liquid cooling jacket 102 is to be mounted.

In the present embodiment, the operation pieces 128A and 128B are provided on the first opposing plate 106 and the wraparound portion 122, respectively. Thus, through an operation of clamping the operation pieces 128A and 128B and applying the force in the approaching direction, the gap between the first heat conductive sheet 108 and the second heat conductive sheet 118 may be widened. For example, as compared to a work of pulling the first opposing plate 106 and the second opposing plate 116 and widening the gap therebetween, an operation of widening the gap between the first heat conductive sheet 108 and the second heat conductive sheet 118 is easy. Further, the operation pieces 128B of the second heat receiving member 114 are provided on the wraparound portion 122. Accordingly, through an operation of clamping the operation pieces 128A and 128B, that is, in the approaching direction, the gap between the first heat conductive sheet 108 and the second heat conductive sheet 118 may be widened. Thus, the operation is easy.

Since the operation pieces 128A and 128B are provided in pairs in the first heat receiving member 104 and the second heat receiving member 114, it is possible to apply a balanced force to both the first heat receiving member 104 and the second heat receiving member 114.

Figure 10:
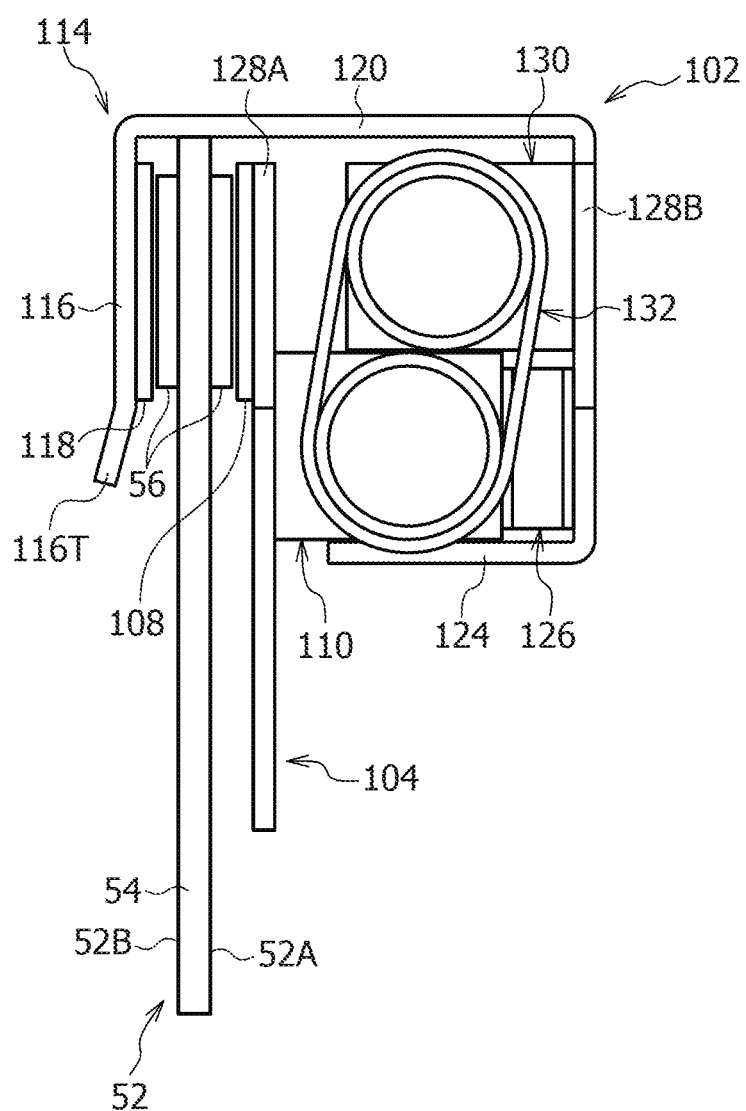
FIG. 10 is a side view illustrating a state where the liquid cooling jacket of the first embodiment is being mounted on the memory module.

In this state, as illustrated in FIG. 10, the memory module 52 is located between the first opposing plate 106 and the second opposing plate 116 such that the liquid cooling jacket 102 covers the memory module 52. Since due to the tapered portion 116T, the gap between the first opposing plate 106 and the second opposing plate 116 is widening downwards, a work of covering the memory module 52 with the liquid cooling jacket 102 is easy. The first heat conductive sheet 108 faces the memory chips 56 on the first surface 52A, and the second heat conductive sheet 118 faces the memory chips 56 on the second surface 52B.

Figure 11:
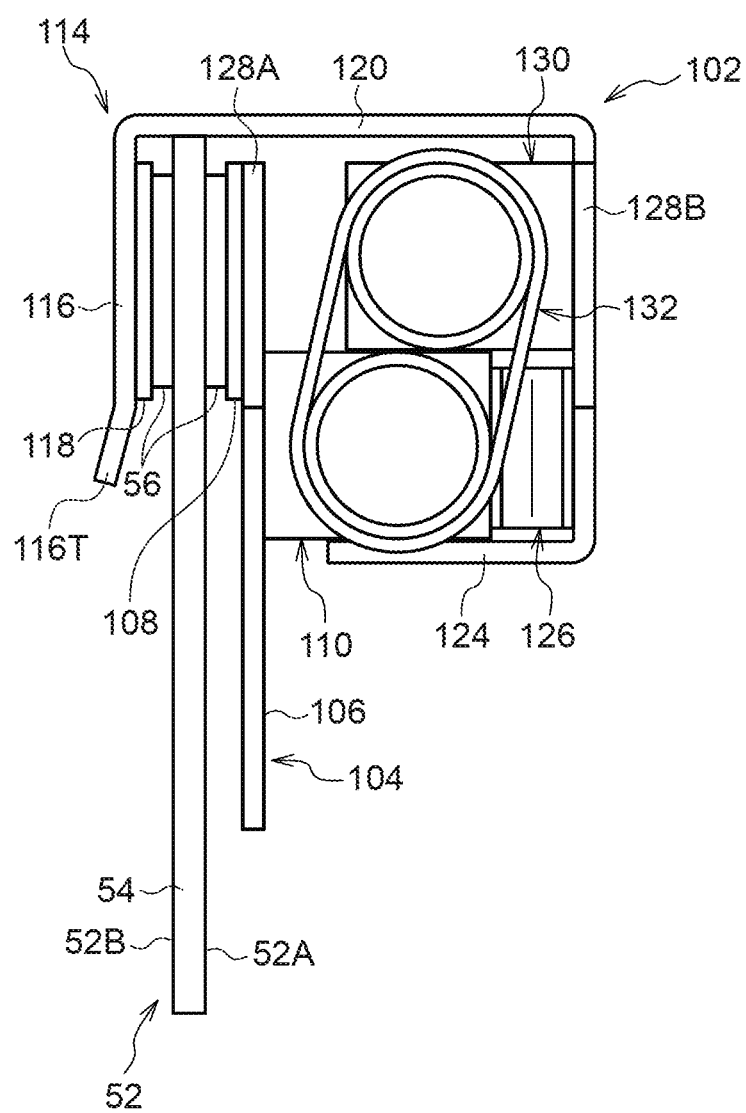
FIG. 11 is a side view illustrating a state where the liquid cooling jacket of the first embodiment is mounted on the memory module.

Next, as illustrated in FIG. 11, when the force applied to the operation pieces 128A is released, the first opposing plate 106 and the second opposing plate 116 relatively approach each other by the elastic force of the plate spring 126. The gap D1 between the first heat conductive sheet 108 and the second heat conductive sheet 118 is narrowed, and thus the first heat conductive sheet 108 is in close contact with the memory chips 56 on the first surface 52A, and the second heat conductive sheet 118 is in close contact with the memory chips 56 on the second surface 52B.

In this state, as indicated by the arrows F1 in FIG. 13, by driving the pump 76 and the heat exchanger 74 of the refrigerant supply device 66, a refrigerant is sent from the manifold 70 to the electronic devices 42. As illustrated in FIG. 12, the refrigerant is sent to the liquid cooling jackets 102. The heat of the memory chips 56 is transferred from the first heat conductive sheet 108 and the second heat conductive sheet 118 to the refrigerant via the first opposing plate 106 and the second opposing plate 116 (the horizontal plate 120 and the wraparound portion 122), and then the memory chips 56 are cooled.

The refrigerants to which heat has been applied from the memory chips 56 merge as indicated by the arrows F3 in FIG. 12, and are cooled by the heat exchange unit 68 through the manifold 70, as indicated by the arrows F4 in FIG. 13. Then, as such a cooled refrigerant circulates through the liquid cooling jackets 102, the memory chips 56 may be cooled.

In the present embodiment, due to the elastic force of the plate spring 126, the first heat conductive sheet 108 is in close contact with the memory chips 56 on the first surface 52A, and the second heat conductive sheet 118 is in close contact with the memory chips 56 on the second surface 52B. Therefore, as compared to that in a structure where the first heat conductive sheet 108 and the second heat conductive sheet 118 are not in close contact with the memory chips 56, heat may be efficiently transferred from the memory chips 56 to the first heat conductive sheet 108 or the second heat conductive sheet 118.

There are various thicknesses T1 (see FIG. 9) of the memory modules 52 depending on types. In order to bring a heat conductive sheet into close contact with the memory chips 56 in accordance with various memory modules 52 having different thicknesses T1, for example, it is considered that a sheet having a thickness corresponding to the thickness of the memory module 52 may be used as the heat conductive sheet. However, in the case of a memory module with a small thickness, when a heat conductive sheet with a large thickness is correspondingly used, heat of the memory chips 56 is less likely to be transferred to the first opposing plate 106 or the second opposing plate 116.

Meanwhile, in the present embodiment, in accordance with the memory chips 56 with various thicknesses, due to the elastic force (pressing force) of the plate spring 126, the first heat conductive sheet 108 may be brought in close contact with the memory chips 56, and the second heat conductive sheet 118 may be brought in close contact with the memory chips 56. As for the first heat conductive sheet 108 and the second heat conductive sheet 118, regardless of the thicknesses of the memory chips 56, sheets having small thicknesses may be used. By using the first heat conductive sheet 108 and the second heat conductive sheet 118 having small thicknesses, it is possible to efficiently cool the memory chips 56.

The position of the plate spring 126 in the height direction is the center position of the first opposing plate 106 in the vertical direction. Accordingly, the plate spring 126 applies an elastic force to the central portion of the first opposing plate 106. Thus, for example, as compared to that in the structure where the plate spring 126 applies an elastic force to the upper end portion or the lower end portion of the first opposing plate 106, the first opposing plate 106 may be suppressed from being inclined or curved.

The plate spring 126 is located between the wraparound portion 122 and the first opposing plate 106. The wraparound portion 122 and the first opposing plate 106 are portions which are relatively separated from each other when the first heat conductive sheet 108 and the second heat conductive sheet 118 relatively approach each other. Accordingly, by effectively using the pressing force of the plate spring 126 as a pressing spring, the wraparound portion 122 and the first opposing plate 106 may be relatively separated from each other so that the first heat receiving member 104 and the second heat receiving member 114 may be biased in an approaching direction.

The plate spring 126 is in contact with the first refrigerant pipe 110 of the first heat receiving member 104, and thus applies the elastic force to the first heat receiving member 104 via the first refrigerant pipe 110. Since the first refrigerant pipe 110 having a high bending rigidity is disposed along the lengthwise direction of the first heat receiving member 104, it is possible to suppress an uneven distribution of the elastic force of the plate spring 126 in the lengthwise direction of the first heat receiving member 104.

The annular rubber 132 is wound around the first refrigerant pipe 110 and the second refrigerant pipe 130. Since a relative distance between the first refrigerant pipe 110 and the second refrigerant pipe 130 may be maintained by an elastic force of the annular rubber 132, it is possible to suppress the first heat receiving member 104 from falling off from the second heat receiving member 114.

The annular rubber 132 is an example of a holding member. Also, it is possible to employ a structure in which as for the holding member, for example, a clip, etc., besides the annular rubber 132, is used so as to maintain a relative position between the first refrigerant pipe 110 and the second refrigerant pipe 130 within a predetermined range. When the annular rubber 132 is used, it is possible to realize a structure in which the relative position between the first refrigerant pipe 110 and the second refrigerant pipe 130 is maintained within a predetermined range with a simple structure.

In the first embodiment, it is also possible to use a liquid cooling jacket 152 according to the following modification (a first modification).

Figure 14:
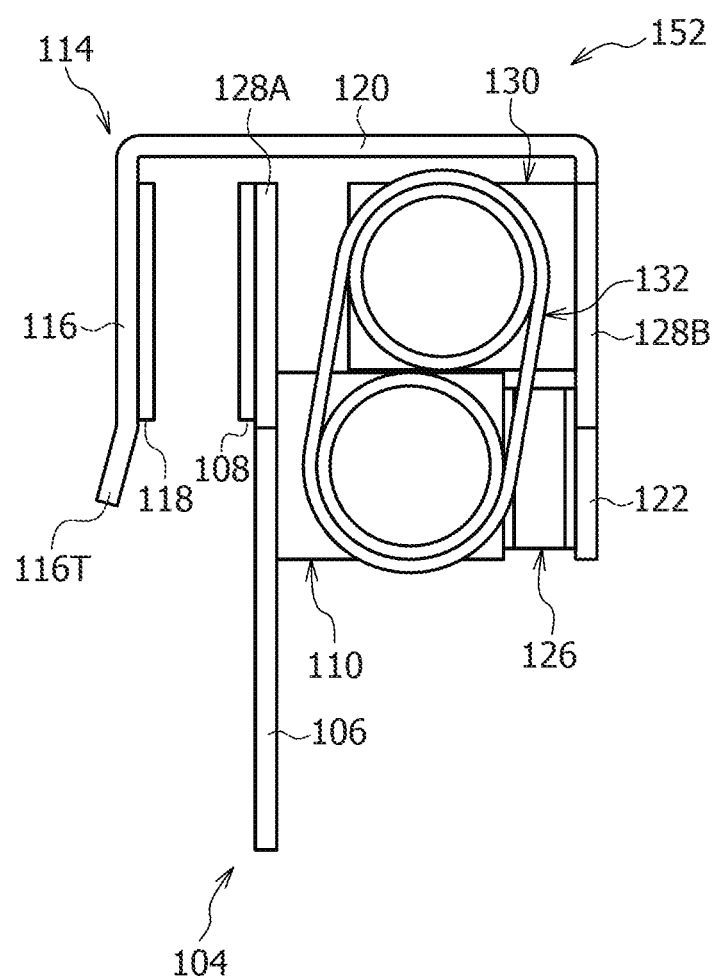
FIG. 14 is a side view illustrating a liquid cooling jacket of a first modification.

As illustrated in FIG. 14, the liquid cooling jacket 152 of the first modification has a structure in which the lower plate 124 (see FIG. 7) is not present in the second heat receiving member 114. Even when the lower plate 124 is not present, it is possible to suppress the first heat receiving member 104 from falling off from the second heat receiving member 114 due to the annular rubber 132. Then, in the liquid cooling jacket 152 of the first modification, since the lower plate 124 is not present, a weight reduction may be achieved.

Second Embodiment

Next, a second embodiment will be described. In the following embodiments and modifications, the same elements and members as those in the first embodiment will be denoted by the same reference numerals, and detailed descriptions thereof will be omitted.

Figure 15:
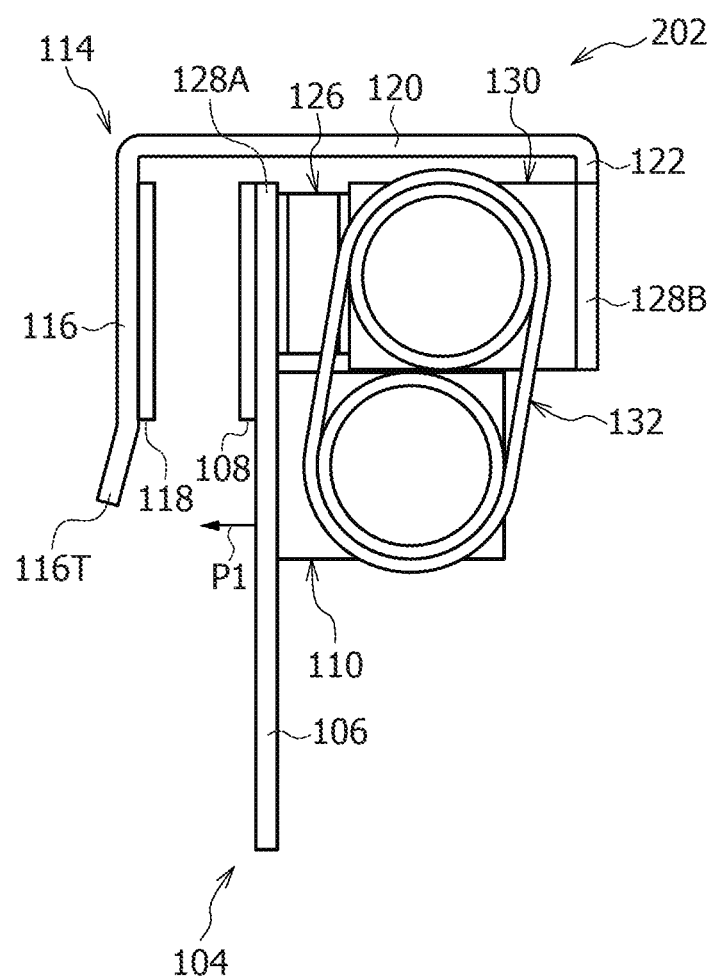
FIG. 15 is a side view illustrating a liquid cooling jacket of a second embodiment.

As illustrated in FIG. 15, in a liquid cooling jacket 202 of the second embodiment, the plate spring 126 is attached to the second refrigerant pipe 130, and is located between the second refrigerant pipe 130 and the first opposing plate 106. That is, the plate spring 126 has a structure that directly pushes the first opposing plate 106 in the arrow P1 direction.

In the liquid cooling jacket 202 of the second embodiment, as compared to that in the liquid cooling jacket 102 of the first embodiment, the wraparound portion 122 may be made small. Thus, a heat conduction path reaching the second refrigerant pipe 130 from the second heat conductive sheet 118 is short. This is advantageous in that heat is efficiently transferred from the second heat conductive sheet 118 to the second refrigerant pipe 130.

Figure 16:
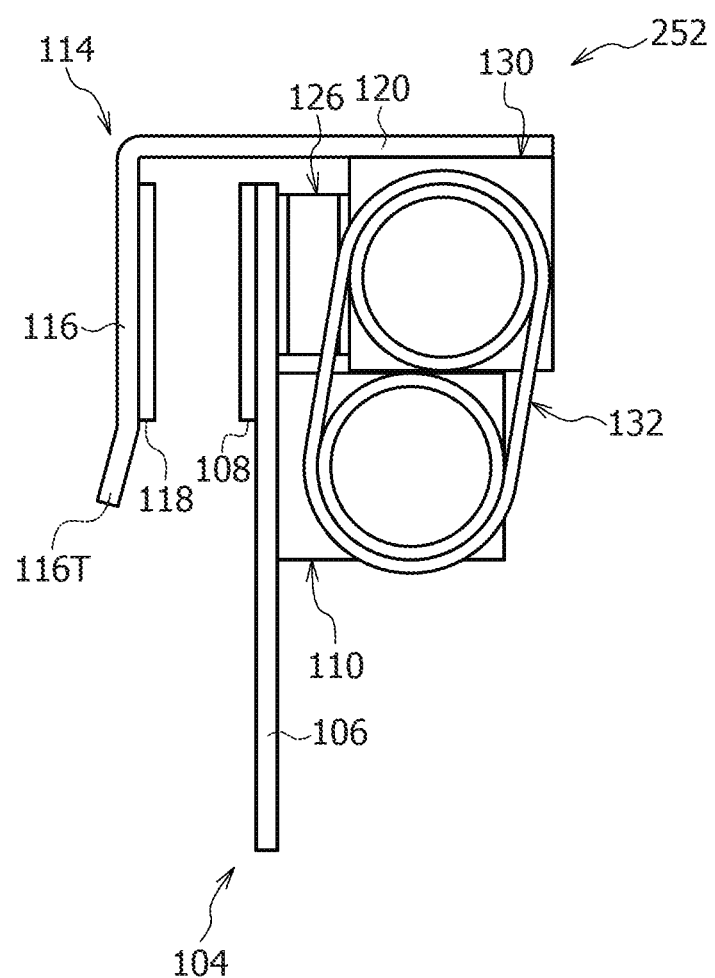
FIG. 16 is a side view illustrating a liquid cooling jacket of a second modification.

In the second embodiment, it is also possible to use a liquid cooling jacket 252 according to the following modification (a second modification). As illustrated in FIG. 16, in the liquid cooling jacket 252 of the second modification, the second refrigerant pipe 130 is fixed to the horizontal plate 120. In the structure of the second modification, the wraparound portion 122 (see FIG. 7) is not present. Thus, a heat conduction path reaching the second refrigerant pipe 130 from the second heat conductive sheet 118 may be made shorter. This is more advantageous in that heat is efficiently transferred from the second heat conductive sheet 118 to the second refrigerant pipe 130.

Third Embodiment

Figure 17:
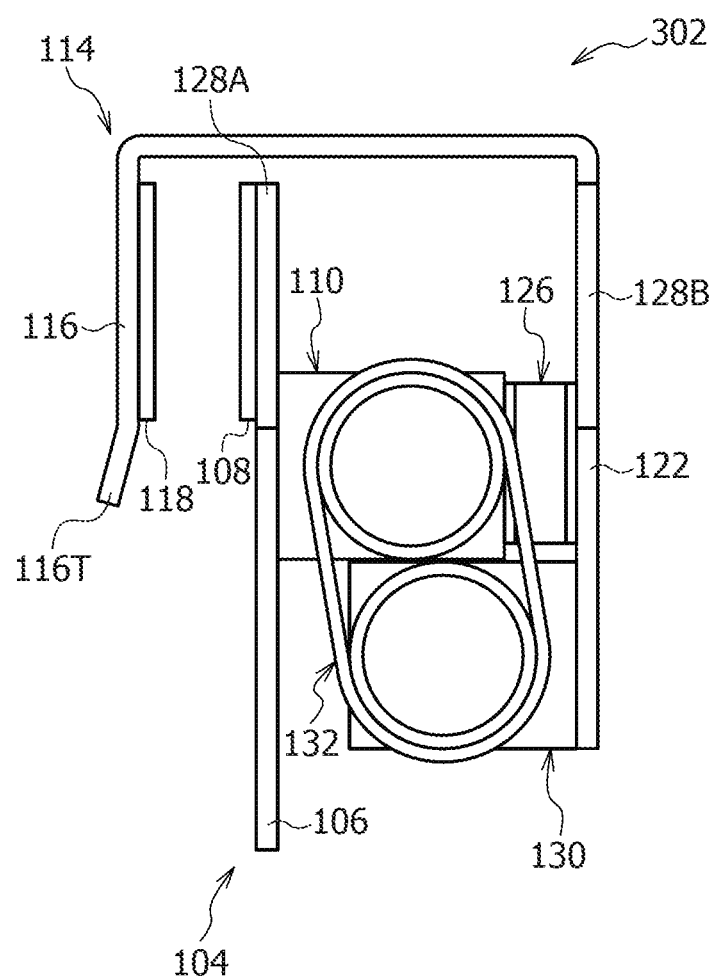
FIG. 17 is a side view illustrating a liquid cooling jacket of a third embodiment.

Next, a third embodiment will be described. As illustrated in FIG. 17, in a liquid cooling jacket 302 of the third embodiment, the second refrigerant pipe 130 is disposed below the first refrigerant pipe 110. As compared to that in the liquid cooling jacket 102 of the first embodiment, the position of the center of gravity is low. Thus, in a state of attachment to the memory module 52, the posture is stable.

Figure 18:
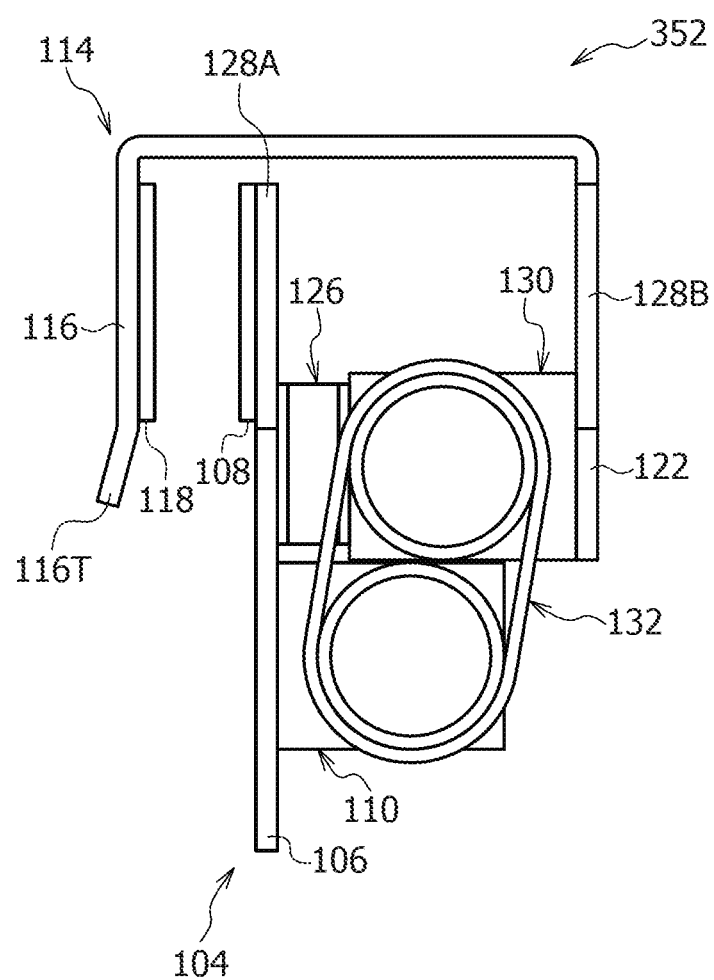
FIG. 18 is a side view illustrating a liquid cooling jacket of a third modification.

In the third embodiment, it is also possible to use a liquid cooling jacket 352 according to the following modification (a third modification). As illustrated in FIG. 18, in the liquid cooling jacket 352 of the third modification, the second refrigerant pipe 130 is disposed at the center position in the vertical direction, and the first refrigerant pipe 110 is disposed below the second refrigerant pipe 130. Then, the plate spring 126 is attached to the second refrigerant pipe 130, and is located between the second refrigerant pipe 130 and the first opposing plate 106.

Fourth Embodiment

Figure 19:
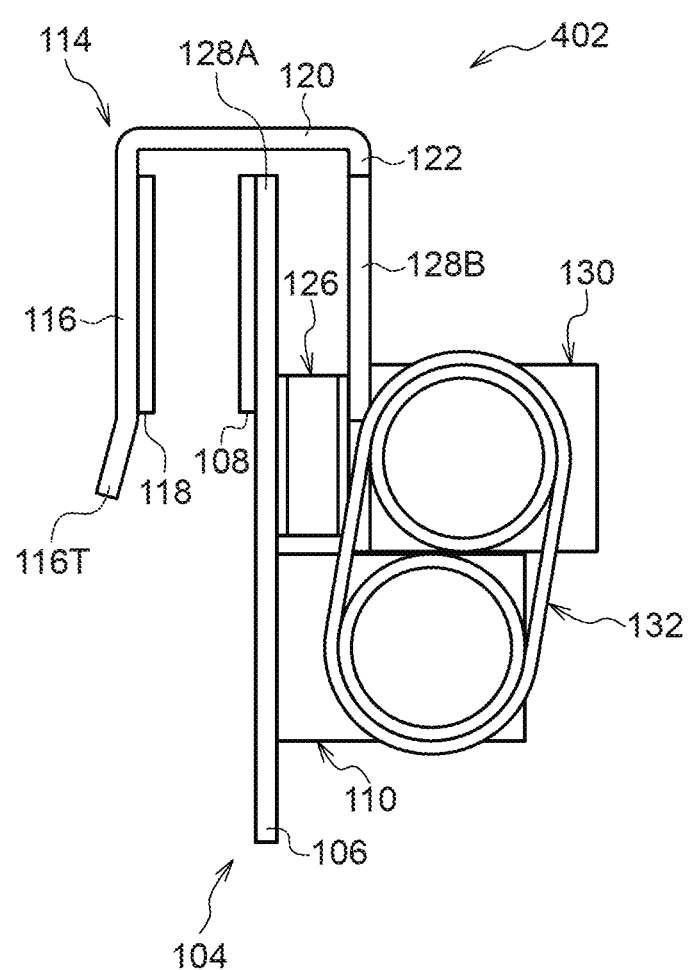
FIG. 19 is a side view illustrating a liquid cooling jacket of a fourth embodiment.

Next, a fourth embodiment will be described. As illustrated in FIG. 19, in a liquid cooling jacket 402 of the fourth embodiment, the width of the horizontal plate 120 is narrower than the width in the liquid cooling jacket 102 of the first embodiment, and the plate spring 126 attached to the wraparound portion 122 is in contact with the first opposing plate 106. Then, the second refrigerant pipe 130 is fixed to a surface of the wraparound portion 122 on the opposite side of a surface to which the plate spring 126 is attached. The first refrigerant pipe 110 is fixed to the first opposing plate 106 below the second refrigerant pipe 130.

In the liquid cooling jacket 402 of the fourth embodiment, as compared to that in the liquid cooling jacket 102 of the first embodiment, the horizontal plate 120 may be made small. Thus, a heat conduction path reaching the second refrigerant pipe 130 from the second heat conductive sheet 118 is short. This is advantageous in that heat is efficiently transferred from the second heat conductive sheet 118 to the second refrigerant pipe 130.

Figure 20:
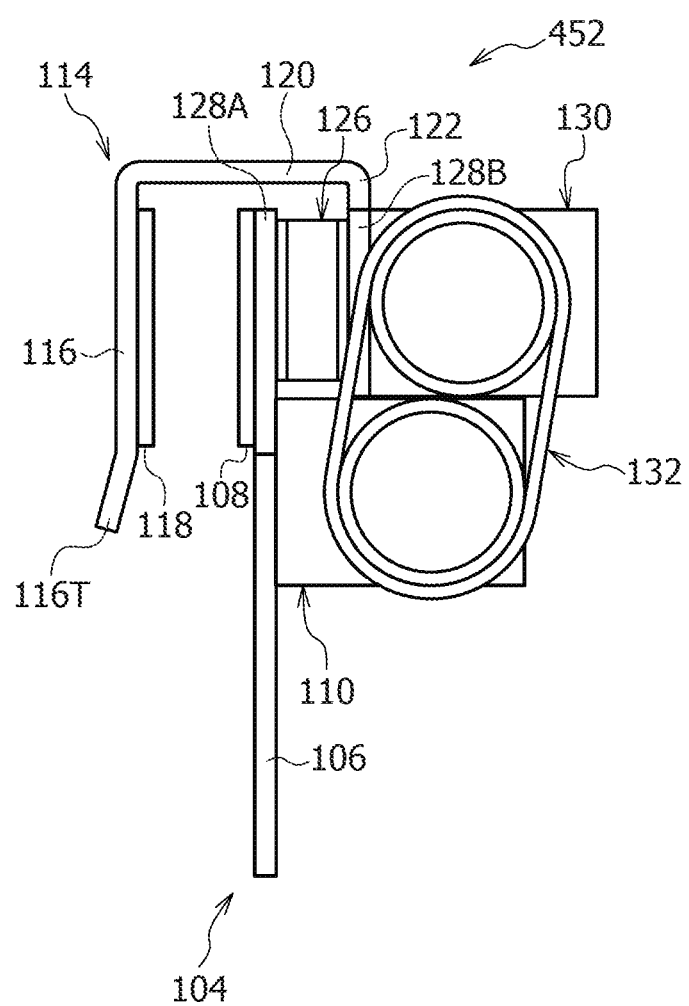
FIG. 20 is a side view illustrating a liquid cooling jacket of a fourth modification.

In the fourth embodiment, it is also possible to use a liquid cooling jacket 452 according to the following modification (a fourth modification). As illustrated in FIG. 20, in the liquid cooling jacket 452 of the fourth modification, the wraparound portion 122 is made shorter than that in the structure illustrated in FIG. 19. Then, the first refrigerant pipe 110 and the second refrigerant pipe 130 are fixed to the first opposing plate 106 and the wraparound portion 122, respectively, at higher positions than those in the fourth embodiment as illustrated in FIG. 19.

In the liquid cooling jacket 452 of the fourth modification, as compared to that in the liquid cooling jacket 402 of the fourth embodiment, the wraparound portion 122 is small. Thus, a heat conduction path reaching the second refrigerant pipe 130 from the second heat conductive sheet 118 is short. This is advantageous in that heat is more efficiently transferred from the second heat conductive sheet 118 to the second refrigerant pipe 130.

Fifth Embodiment

Figure 21:
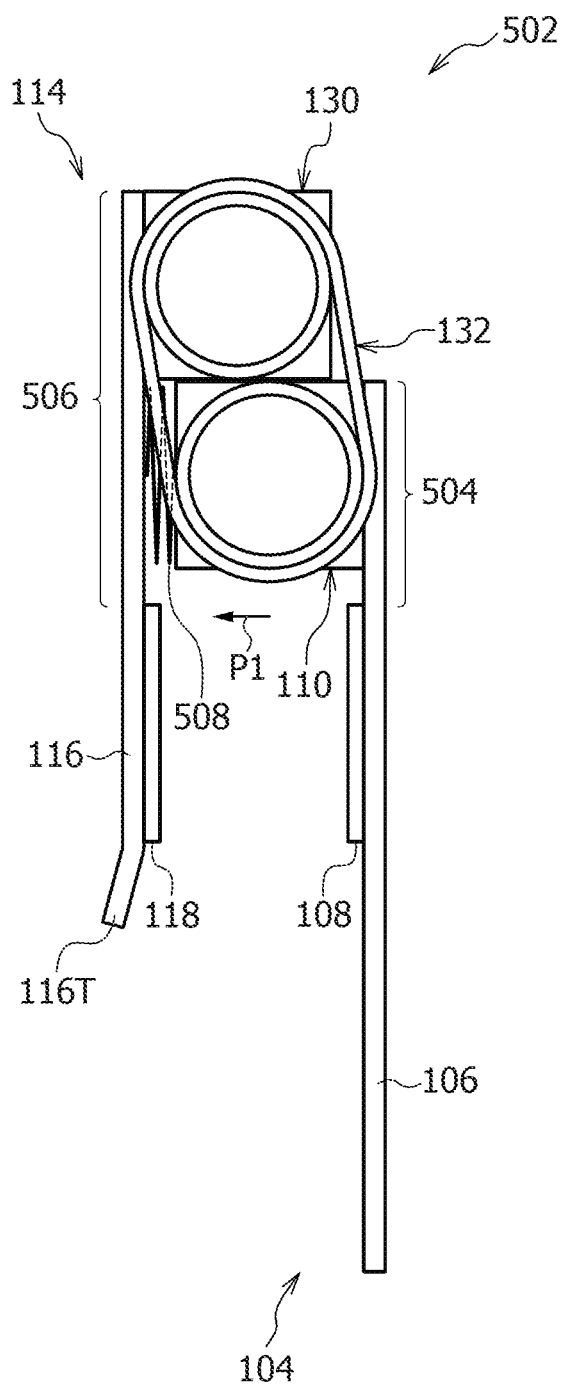
FIG. 21 is a side view illustrating a liquid cooling jacket of a fifth embodiment.

Next, a fifth embodiment will be described. As illustrated in FIG. 21, in a liquid cooling jacket 502 of the fifth embodiment, the first heat receiving member 104 includes a first extension portion 504 that linearly extends upwards from the upper portion of the first opposing plate 106. Further, the second heat receiving member 114 includes a second extension portion 506 that linearly extends upwards (further above the first extension portion 504) from the upper portion of the second opposing plate 116. The first refrigerant pipe 110 is fixed to a surface of the first extension portion 504 facing the second extension portion 506. The second refrigerant pipe 130 is fixed to the second extension portion 506 above the first refrigerant pipe 110.

A coil spring 508 is disposed in a gap between the first refrigerant pipe 110 and the second extension portion 506. The coil spring 508 is attached to the first refrigerant pipe 110 and the second extension portion 506, and applies a tensile force to the first refrigerant pipe 110 in the arrow P1 direction.

In the liquid cooling jacket 502 of the fifth embodiment, by the elastic force (tensile force) of the coil spring 508, the first heat conductive sheet 108 is biased such that the first heat receiving member 104 is directed to the second heat receiving member 114. Accordingly, the first heat conductive sheet 108 may be brought into close contact with the memory chips 56, and the second heat conductive sheet 118 may be brought into close contact with the memory chips 56.

The first refrigerant pipe 110 and the second refrigerant pipe 130 do not protrude in the normal direction of the first opposing plate 106, that is, on the right side of the first opposing plate 106 or on the left side of the second opposing plate 116 in FIG. 21. That is, the thickness of the liquid cooling jacket 502 may be reduced. Therefore, even in a structure where the memory modules 52 (see FIG. 1) are disposed at a high density in the thickness direction, it is easy to mount the liquid cooling jacket 502 on each of the memory modules 52 disposed at the high density, without disturbance of the first refrigerant pipe 110 or the second refrigerant pipe 130.

Figure 22:
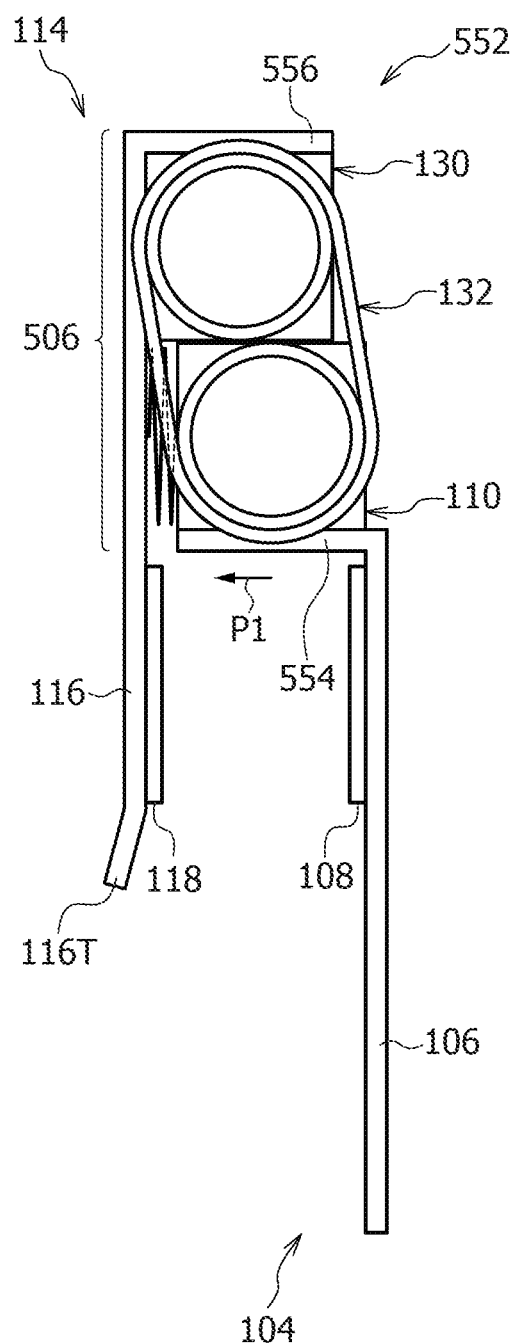
FIG. 22 is a side view illustrating a liquid cooling jacket of a fifth modification.

In the fifth embodiment, it is also possible to use a liquid cooling jacket 552 according to the following modification (a fifth modification). As illustrated in FIG. 22, in the liquid cooling jacket 552 of the fifth modification, the first heat receiving member 104 includes a first upper plate 554 that extends toward the second heat receiving member 114 from the upper portion of the first opposing plate 106. The first refrigerant pipe 110 is fixed to the top surface of the first upper plate 554. Further, in the second heat receiving member 114, a second upper plate 556 extends from the upper end of the second extension portion 506 in parallel to the first upper plate 554. The second refrigerant pipe 130 is fixed to the bottom surface of the second upper plate 556.

In the liquid cooling jacket 552 of the fifth modification as well, the first refrigerant pipe 110 and the second refrigerant pipe 130 do not protrude on the right side of the first opposing plate 106 or on the left side of the second opposing plate 116. Thus, even when the memory modules 52 are disposed at a high density, it is easy to mount the liquid cooling jacket 552 on each of the memory modules 52.

In contrast, in each of the first to fourth embodiments and modifications thereof, the first refrigerant pipe 110 or the second refrigerant pipe 130 does not protrude upwards from the first opposing plate 106 or the second opposing plate 116. Therefore, it is easy to dispose another member above a liquid cooling module. In the electronic device 42 (see FIG. 2), the influence of the height of the liquid cooling module, on the entire height of the electronic device 42, may be reduced. This may contribute to the height reduction of the electronic device 42.

In the first modification (see FIG. 14), the third embodiment (see FIG. 17), the third modification (see FIG. 18), and the fourth embodiment (see FIG. 19) as described above, as in the first embodiment (see FIG. 7), the position of the plate spring 126 in the height direction is the center position of the first opposing plate 106 in the vertical direction. Since the plate spring 126 applies an elastic force to the central portion of the first opposing plate 106, the first opposing plate 106 may be suppressed from being inclined or curved.

In contrast, in the second embodiment (see FIG. 15), the second modification (see FIG. 16), and the fourth modification (see FIG. 20), the position of the plate spring 126 in the height direction corresponds to the upper portion in the first opposing plate 106 and has the same height as the first heat conductive sheet 108. Accordingly, by effectively using the elastic force of the plate spring 126, the first heat conductive sheet 108 may be brought into close contact with the memory chips 56.

Figure 23:
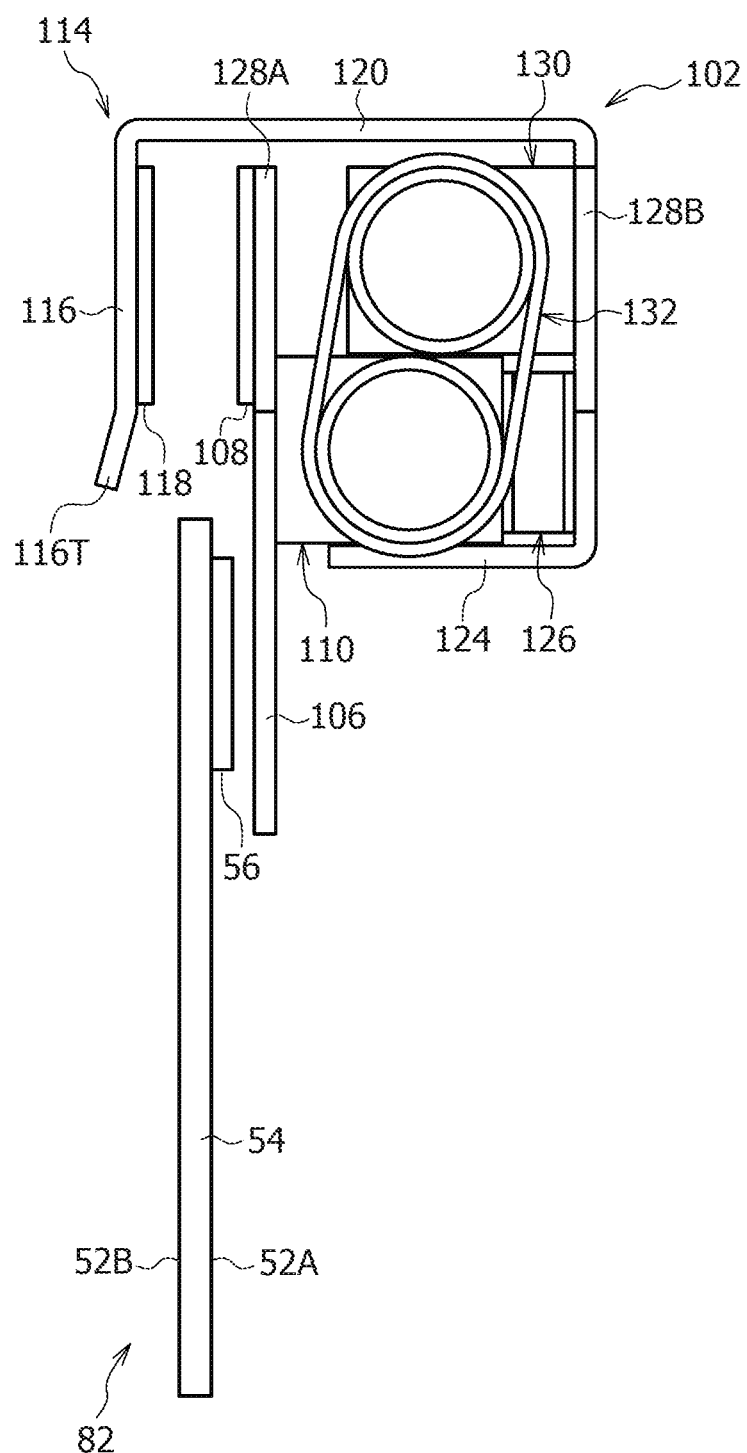
FIG. 23 is a side view illustrating another example of the memory module on which the liquid cooling jacket is to be mounted, which is different from that in FIG. 9.

In each of the embodiments as described above, a memory module on which a liquid cooling jacket is to be mounted is not limited to the memory module with a structure where the memory chips 56 are mounted on both surfaces (the first surface 52A and the second surface 52B) of the memory board 54 as illustrated in FIG. 1 and FIGS. 9 to 11. For example, as illustrated in FIG. 23, a memory module 82 in which the memory chips 56 are mounted on only one surface (the first surface 52A) of the memory board 54 may be employed. In this case, the second heat conductive sheet 118 may directly come in contact with the memory board 54. However, the second heat conductive sheet 118 has an insulating property, and thus does not affect the characteristics of the memory module 52 or short-circuit a part of circuits.

In each of the embodiments as described above, although descriptions have been made on an example in which an opposing member is the second heat receiving member 114 having the second refrigerant pipe 130 and the second heat conductive sheet 118, the opposing member may have a structure not including the second refrigerant pipe 130 or the second heat conductive sheet 118. In this case, it is possible to employ a structure in which the opposing member is in contact with the second surface 52B of the memory module 52, and the first heat receiving member 104 approaches the opposing member by a biasing force of a biasing member (for example, the plate spring 126 or the coil spring 508), so that the first heat conductive sheet 108 is brought into close contact with the memory chips 56 on the first surface 52A.

As in each of the embodiments as described above, when the opposing member is the second heat receiving member 114 having the second refrigerant pipe 130 and the second heat conductive sheet 118, the memory chips 56 on the second surface 52B may be effectively cooled on the second surface 52B of the memory module 52 as well.

In each of the embodiments as described above, a cooling target is not limited to the memory module 52 (or the memory chips 56 of the memory module 52). On a board on which various electronic components or chips are mounted, for example, on various boards or cards to be mounted within a computer, it is possible to cool the electronic components or the chips by using the liquid cooling jacket in each embodiment.

Although embodiments of a technology according to the present disclosure have been described so far, the technology according to the present disclosure is not limited to the above. In addition to the above, it is natural that various modifications may be carried out within the scope not deviating from the gist.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid cooling jacket comprising:
    a first heat receiver configured to include a first refrigerant pipe through which a refrigerant flows and a first heat conductive sheet that receives heat by being in contact with a cooling target;
    a second heat receiver capable of approaching and separating from the first heat receiver and configured to face the first heat conductive sheet; and
    a spring configured to bias the first heat receiver and the second heat receiver in an approaching direction,
    wherein the second heat receiver includes a wraparound portion that wraps around a back surface side of the first heat conductive sheet in the first heat receiver, and
    wherein the spring is disposed between the wraparound portion and the first heat receiver to press the first heat receiver.

2. The liquid cooling jacket according to claim 1,
    wherein the second heat receiver includes a second refrigerant pipe through which the refrigerant flows, and a second heat conductive sheet that receives heat by being in contact with the cooling target on a back surface of a surface in contact with the first heat conductive sheet.

3. The liquid cooling jacket according to claim 2,
    wherein the first refrigerant pipe and the second refrigerant pipe are aligned in parallel to each other.

4. The liquid cooling jacket according to claim 1,
    wherein the spring applies a biasing force to a central portion of the first heat receiver.

5. The liquid cooling jacket according to claim 1,
    wherein the spring biases the first heat receiver via the first refrigerant pipe.

6. The liquid cooling jacket according to claim 1, further comprising:
    an operation piece to which an operation force is applied in a direction in which the first heat receiver and the second heat receiver are separated from each other.

7. The liquid cooling jacket according to claim 6,
    wherein, in the second heat receiver, the operation piece is provided on the wraparound portion.

8. The liquid cooling jacket according to claim 6,
    wherein, in the first heat receiver and the second heat receiver, the operation piece protrudes in pairs on both sides of the first refrigerant pipe in an extending direction.

9. The liquid cooling jacket according to claim 1, further comprising:
    a holding member configured to integrally hold the first heat receiver and the second heat receiver.

10. The liquid cooling jacket according to claim 9,
    wherein the holding member is an annular rubber that binds the first heat receiver and the second heat receiver by an elastic force.

11. A liquid cooling system comprising:
    a liquid cooling jacket configured to include:
    a first heat receiver configured to include a first refrigerant pipe through which a refrigerant flows and a first heat conductive sheet that receives heat by being in contact with a cooling target,
    a second heat receiver capable of approaching and separating from the first heat receiver and configured to face the first heat conductive sheet,
    a spring configured to bias the first heat receiver and the second heat receiver in an approaching direction; and
    a refrigerant supply device configured to supply the refrigerant to the first refrigerant pipe,
    wherein the second heat receiver includes a wraparound portion that wraps around a back surface side of the first heat conductive sheet in the first heat receiver, and
    wherein the spring is disposed between the wraparound portion and the first heat receiver to press the first heat receiver.

12. The liquid cooling system according to claim 11,
    wherein the second heat receiver includes a second refrigerant pipe through which the refrigerant flows, and a second heat conductive sheet that receives heat by being in contact with the cooling target on a back surface of a surface in contact with the first heat conductive sheet, and
    wherein the refrigerant supply device supplies the refrigerant to the second refrigerant pipe.

13. An electronic device comprising:
    a liquid cooling jacket configured to include:
    a first heat receiver configured to include a first refrigerant pipe through which a refrigerant flows and a first heat conductive sheet that receives heat by being in contact with a cooling target,
    a second heat receiver capable of approaching and separating from the first heat receiver and configured to face the first heat conductive sheet,
    a spring configured to bias the first heat receiver and the second heat receiver in an approaching direction; and
    an electric component with which the first heat conductive sheet comes in contact by a biasing force of the spring, the electric component being the cooling target,
    wherein the second heat receiver includes a wraparound portion that wraps around a back surface side of the first heat conductive sheet in the first heat receiver, and
    wherein the spring is disposed between the wraparound portion and the first heat receiver to press the first heat receiver.

14. The electronic device according to claim 13,
    wherein the second heat receiver includes a second refrigerant pipe through which the refrigerant flows, and a second heat conductive sheet that receives heat by being in contact with the cooling target on a back surface of a surface in contact with the first heat conductive sheet, and wherein the second heat conductive sheet comes in contact with the back surface by a biasing force of the spring.

* * * * *